(12) United States Patent
Jomaa et al.

(10) Patent No.: US 9,269,681 B2
(45) Date of Patent: Feb. 23, 2016

(54) SURFACE FINISH ON TRACE FOR A THERMAL COMPRESSION FLIP CHIP (TCFC)

(71) Applicant: QUALCOMM Incorporated, San Diego, CA (US)

(72) Inventors: Houssam W. Jomaa, San Diego, CA (US); Omar J. Bchir, San Marcos, CA (US); Milind P. Shah, San Diego, CA (US); Manuel Aldrete, San Diego, CA (US); Chin-Kwan Kim, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 88 days.

(21) Appl. No.: 13/741,810

(22) Filed: Jan. 15, 2013

(65) Prior Publication Data

US 2014/0138831 A1 May 22, 2014

Related U.S. Application Data

(60) Provisional application No. 61/727,188, filed on Nov. 16, 2012.

(51) Int. Cl.
*H01L 21/56* (2006.01)
*H01L 23/00* (2006.01)

(52) U.S. Cl.
CPC .............. *H01L 24/11* (2013.01); *H01L 21/563* (2013.01); *H01L 24/81* (2013.01); *H01L 24/13* (2013.01); *H01L 24/16* (2013.01);
(Continued)

(58) Field of Classification Search
CPC ........ H01L 24/11; H01L 24/12; H01L 21/563; H01L 24/81; H01L 2224/32225; H01L 2224/83192; H01L 2224/73204; H01L 2224/81815; H01L 2224/81464; H01L 2224/81455; H01L 2224/81444; H01L 2224/81203; H01L 2224/81191; H01L 2224/16238; H01L 2224/13082; H01L 24/16; H01L 24/13; H01L 2224/13147
USPC .................. 257/98, 737, 738, 778, 668, 750; 438/123, 608, 121
See application file for complete search history.

(56) References Cited

U.S. PATENT DOCUMENTS 4,447,857 A       5/1984 Marks et al.
5,801,100 A   *   9/1998 Lee et al. ...................... 438/678
(Continued)

FOREIGN PATENT DOCUMENTS

JP      2000-22027 A   *   2/2000
JP      2004-23072 A   *   1/2004
(Continued)

*Primary Examiner* — Alexander Oiscar Williams
(74) *Attorney, Agent, or Firm* — Linda G. Gunderson

(57) ABSTRACT

Some implementations provide a semiconductor device that includes a substrate coupled to a die through a thermal compression bonding process. The semiconductor device also includes a trace coupled to the substrate. The trace includes a first conductive material having a first oxidation property. The trace also includes a first surface layer including a second conductive material having a second oxidation property. The second oxidation property is less susceptible to oxidation than the first oxidation property. The first and second conductive materials are configured to provide an electrical path between the die and the substrate. The first surface layer has a thickness that is 0.3 microns (μm) or less.

7 Claims, 11 Drawing Sheets

(52) U.S. Cl.
CPC .......... *H01L 2224/131* (2013.01); *H01L 2224/13082* (2013.01); *H01L 2224/13147* (2013.01); *H01L 2224/16238* (2013.01); *H01L 2224/27011* (2013.01); *H01L 2224/32225* (2013.01); *H01L 2224/73204* (2013.01); *H01L 2224/81191* (2013.01); *H01L 2224/81203* (2013.01); *H01L 2224/81444* (2013.01); *H01L 2224/81455* (2013.01); *H01L 2224/81464* (2013.01); *H01L 2224/81815* (2013.01); *H01L 2224/83192* (2013.01)

(56) References Cited

U.S. PATENT DOCUMENTS

| | | | |
|---|---|---|---|
| 6,225,569 B1 * | 5/2001 | Hashimoto et al. | 174/260 |
| 8,232,643 B2 | 7/2012 | Chuang et al. | |
| 8,642,384 B2 * | 2/2014 | Lee et al. | 438/110 |
| 2003/0127747 A1 * | 7/2003 | Kajiwara et al. | 257/778 |
| 2003/0134497 A1 * | 7/2003 | Saijo et al. | 438/612 |
| 2004/0084206 A1 | 5/2004 | Tung | |
| 2007/0145584 A1 * | 6/2007 | Kataoka et al. | 257/736 |
| 2007/0152330 A1 * | 7/2007 | Wang | 257/737 |
| 2008/0211095 A1 * | 9/2008 | Nishizawa | 257/746 |
| 2009/0001604 A1 * | 1/2009 | Tanaka et al. | 257/778 |
| 2009/0140419 A1 | 6/2009 | Rhyner et al. | |
| 2009/0315178 A1 * | 12/2009 | Sakurai et al. | 257/737 |
| 2010/0109159 A1 * | 5/2010 | Ho et al. | 257/737 |
| 2010/0203658 A1 * | 8/2010 | Aida et al. | 438/27 |
| 2010/0276572 A1 * | 11/2010 | Iwabuchi et al. | 250/208.1 |
| 2012/0032322 A1 | 2/2012 | Lin et al. | |
| 2013/0034934 A1 * | 2/2013 | Meguro et al. | 438/113 |
| 2013/0099370 A1 * | 4/2013 | Cheng et al. | 257/737 |
| 2013/0099371 A1 * | 4/2013 | Cheng et al. | 257/737 |
| 2013/0250533 A1 * | 9/2013 | Kodani et al. | 361/767 |
| 2013/0277830 A1 * | 10/2013 | Yu et al. | 257/737 |
| 2014/0103503 A1 * | 4/2014 | Lee et al. | 257/668 |
| 2014/0124924 A1 * | 5/2014 | Chang | 257/737 |
| 2014/0167253 A1 * | 6/2014 | Tseng et al. | 257/737 |
| 2014/0191391 A1 * | 7/2014 | Chuang et al. | 257/737 |
| 2014/0217450 A1 * | 8/2014 | Ishigami et al. | 257/98 |
| 2014/0346673 A1 * | 11/2014 | Lin et al. | 257/737 |

FOREIGN PATENT DOCUMENTS

| | | | |
|---|---|---|---|
| JP | 2003-229451 A | * | 8/2008 |
| JP | 2011-119722 | * | 6/2011 |

* cited by examiner

SURFACE FINISH ON TRACE FOR A THERMAL COMPRESSION FLIP CHIP (TCFC)

The present Application for Patent claims priority to U.S. Provisional Patent Application No. 61/727,188, filed Nov. 16, 2012, entitled "Surface Finish on Trace for a Thermal Compression Flip Chip (TCFC)", which is hereby expressly incorporated by reference.

FIELD

Various features relate to a surface finish on trace for a thermal compression flip chip.

BACKGROUND

A thermal compression bonding process is a process used to assemble/package a flip chip, die or semiconductor device to a packaging substrate. Such a flip chip is often referred to as a thermal compression flip chip (TCFC). FIG. 1 illustrates an example of a package that includes a chip/die coupled to a substrate using a thermal compression bonding process. As shown in FIG. 1, a package 100 includes a die/chip 102 that is coupled to a substrate 104. There are several electrical connections 106 and a non-conducting paste (NCP) 108 between the chip 102 and the substrate 104. The electrical connections may be defined by under bump metallization (UBM) structures (e.g., UBM structure 110), solder (e.g., solder 112) and traces (e.g., trace 114). The NCP 108 provides a protective layer that covers the electrical connections between the chip 102 and the substrate 104.

FIG. 2 illustrates an example of how a chip/die may be assembled to a package by using a thermal compression bonding process. Specifically, FIG. 2 illustrates a package 200 and a die 202. The package 200 includes a packaging substrate 204 and several traces 206a-c. FIG. 2 also illustrates a non conductive paste (NCP) 208, which is usually dispensed on top of the traces 206a-c before thermo-compression is done. The NCP 208 may have fluxing capabilities, which means the NCP 208 may be capable of removing oxide from materials (e.g., remove oxide from humps and/or traces). Oxide is a material layer that may be formed on the surface of an underlying material when the underlying material is exposed to air, water and/or other chemicals. The die 202 includes several bumps 210a-c. Each of the bumps 210a-c respectively includes copper pillars 212a-c and may also include solders 214a-c.

One of the challenges with a thermal compression bonding process is controlling or preventing the oxidation of the trace, which can lead to weak joints or non-connects. A trace is typically made of copper, which can be easily oxidized. That is, an oxide layer easily forms on the copper surface. As mentioned above, oxidation occurs when the material is subject to air, water and/or other oxidizing environments. Oxidation may be problematic because oxide on a material may prevent solder from properly wetting to the material. Thus, one of the problems that may arise during a thermal compression bonding process is that the solder (e.g., solder 214b) may not properly wet with a trace (e.g., trace 206b) on the substrate side, therefore preventing a good joint from forming between the solder and the trace. Thus, in some implementations, the result of the oxide on the trace is an open or poor joint. In an open joint, there is no connection between the solder and the trace. In a poor joint, the connection between the solder and the trace is very weak and will likely fail over the life of the die and/or package.

FIG. 3 illustrates a die assembled to a package after a thermal compression bonding process. Specifically, FIG. 3 illustrates the package 200 and the die 202 of FIG. 2 after a thermal compression bonding process. As shown in FIG. 3, the bump 210a is coupled to the trace 206a. Similarly, the bump 210b is coupled to the trace 206b, and the bump 210c is coupled to the trace 206c. As shown in FIG. 3, the joint between the solder 214b (of the bump 210b) and the trace 206b is poor, as illustrated by the fact that the solder 214b is barely in contact with the trace 206b. Although there is a connection between the solder 214b and the trace 206b, this connection will eventually fail. In contrast, the joint between the solder 214a and the trace 206a is better, since the solder 214a is in contact with more surface area of the trace 206a.

Therefore, there is a need for an improved design to ensure solid joints are created between solder and trace.

SUMMARY

Various features, apparatus and methods described herein provide a surface finish on trace for a thermal compression flip chip (TCFC).

A first example provides a semiconductor device that includes a substrate coupled to a die through a thermal compression bonding process. The semiconductor device also includes a trace coupled to the substrate. The trace includes a first conductive material having a first oxidation property. The trace also includes a first surface layer including a second conductive material having a second oxidation property. The second oxidation property is less susceptible to oxidation than the first oxidation property. The first and second conductive materials are configured to provide an electrical path between the die and the substrate. The first surface layer has a thickness that is 0.3 microns ($\mu$m) or less.

According to one aspect, the trace also includes a second surface layer made of a third conductive material having a third oxidation property. The second material is nickel and the third material is gold in some implementations. The second material is nickel and the third material is palladium in some implementations. The second material is gold and the third material is palladium in some implementations. In some implementations, the second material is palladium and the third material is gold. The thickness of the palladium is 0.1 microns ($\mu$m) or less and the thickness of gold is 0.1 microns ($\mu$m) or less in some implementations.

According to an aspect, the first surface layer made of nickel is coupled to the trace using a plating process. In some implementations, the plating process is an electroless plating process.

According to another aspect, the palladium surface layer is coupled to the trace using an electroless plating process and the gold surface layer is coupled to the trace using an immersion plating process.

According to yet another aspect, the semiconductor device further includes several traces, where the pitch between traces is less than 100 microns ($\mu$m). In some implementations, a pitch defines a center to center distance between two neighboring traces. In some implementations, each respective trace has a respective surface layer, where the spacing between surface layers of traces is between 10-20 microns ($\mu$m). A spacing defines a distance between edges of surface layers of two neighboring traces, in some implementations.

A second example provides a semiconductor device that includes a substrate coupled to a die. The semiconductor device also includes a trace coupled to the substrate. The trace includes a first conductive material having a first oxidation property. The trace also includes a first surface layer including a nickel having a second oxidation property. The second oxidation property is less susceptible to oxidation than the first oxidation property. The first and second conductive materials are configured to provide an electrical path between the die and the substrate. The first nickel surface layer has a thickness that is 0.3 microns (μm) or less.

According to one aspect, the trace further includes a second surface layer made of palladium. In some implementations, the palladium surface layer has a thickness between 0.02-0.08 microns (μm). In some implementations, the palladium surface layer is coupled to the trace using an electroless plating process.

According to another aspect, the trace further includes a third surface layer made of gold. In some implementations, the gold surface layer has a thickness between 0.03-0.1 microns (μm). In some implementations, the gold surface layer is coupled to the trace using an immersion plating process.

According to one aspect, the thickness of the nickel is between 0.1-0.3 microns (μm). In some implementations, the nickel surface layer is coupled to the trace using an electroless plating process.

A third example provides a method for manufacturing a substrate. The method provides the substrate. The method further provides several traces. Each trace includes a first conductive material having a first oxidation property. The method further provides at least one surface layer for each trace. The surface layer is made of a second conductive material that has a second oxidation property. The second oxidation property is less susceptible to oxidation than the first oxidation property. The first and second conductive materials provide an electrical path for a die when the die is mounted on the substrate. The surface layer has a thickness that is 0.3 microns (μm) or less.

According to one aspect, providing the at least one surface layer includes providing a first surface layer, a second surface layer and a third surface layer for each plurality of traces. In some implementations, the first surface layer is nickel that has a thickness of 0.3 microns (μm) or less, the second surface layer is palladium having a thickness of 0.1 microns (μm) or less, and the third surface layer is gold having a thickness of 0.1 microns (μm). In some implementations, the surface layer, which includes the first, second and third layers, has a thickness of 0.48 microns (μm) or less, According to an aspect, providing the at least one surface layer includes performing a plating process. In some implementations, the plating process is one of at least an electroless plating process and/or an immersion plating process.

According to another aspect, providing the at least one surface layer includes providing a first surface layer and a second surface layer for each plurality of traces. In some implementations, the first surface layer is palladium having a thickness of 0.1 microns (μm) or less, and the second surface layer is gold having a thickness of 0.1 microns (μm) or less. In some implementations, the pitch between traces is less than 100 microns (μm). A pitch defines a center to center distance between two neighboring traces. In some implementations, the spacing between surface layers of traces is between 10-20 microns (μm). A spacing defines a distance between edges of surface layers of two neighboring traces in some implementations.

A fourth example provides a method for assembling a semiconductor package. The method provides a die that includes a plurality of under bump metallization (UBM) structure. The method also provides a packaging substrate that includes several traces. Each trace is made of a first conductive material having a first oxidation property. The method provides at least one surface layer for each trace. The surface layer is made of a second conductive material that has a second oxidation property. The second oxidation property is less susceptible to oxidation than the first oxidation property. The first and second conductive materials provide an electrical path for a die when the die is mounted on the substrate. The surface layer has a thickness that is 0.3 microns (μm) or less. The method couples the die to the packaging substrate to define semiconductor package.

According to one aspect, providing the at least one surface layer includes performing a plating process. In some implementations, the plating process is one of at least an electroless plating process and/or an immersion plating process.

According to an aspect, providing the at least one surface layer includes providing a first surface layer, a second surface layer and a third surface layer for each trace. In some implementations, the first surface layer is nickel having a thickness of 0.3 microns (μm) or less, the second surface layer is palladium having a thickness of 0.1 microns (μm) or less, and the third surface layer is gold having a thickness of 0.1 microns (μm).

According to another aspect, providing the at least one surface layer includes providing a first surface layer and a second surface layer for each trace. In some implementations, the first surface layer is palladium having a thickness of 0.1 microns (μm) or less, the second surface layer is gold having a thickness of 0.1 microns (μm) or less.

According to an aspect, the pitch between traces is less than 100 microns (μm). In some implementations, a pitch defines a center to center distance between two neighboring traces. Each respective trace has a respective surface layer. In some implementations, the spacing between surface layers of traces is between 10-20 microns (μm). In some implementations, a spacing defines a distance between edges of surface layers of two neighboring traces.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some exemplary implementations of this disclosure pertain to a semiconductor device that includes a substrate coupled to a die through a thermal compression bonding process. The semiconductor device also includes a trace coupled to the substrate. The trace includes a first conductive material having a first oxidation property. The trace also includes a first surface layer including a second conductive material having a second oxidation property. The second oxidation property is less susceptible to oxidation than the first oxidation property. The first and second conductive materials are configured to provide an electrical path between the die and the substrate. The first surface layer has a thickness that is 0.3 microns ($\mu$m) or less. In some implementations, the trace includes several surface layers, where each surface layer is made of a different material. Each surface layer has an oxidation property that is less susceptible to oxidation than the first oxidation property of the trace.

Some exemplary implementations of this disclosure pertain to a semiconductor device that includes a substrate coupled to a die. The semiconductor device also includes a trace coupled to the substrate. The trace includes a first conductive material having a first oxidation property. The trace also includes a first surface layer including a nickel having a second oxidation property. The second oxidation property is less susceptible to oxidation than the first oxidation property. The first and second conductive materials are configured to provide an electrical path between the die and the substrate. The first nickel surface layer has a thickness that is 0.3 microns ($\mu$m) or less.

Exemplary Surface Layer on a Trace

Figure 1:
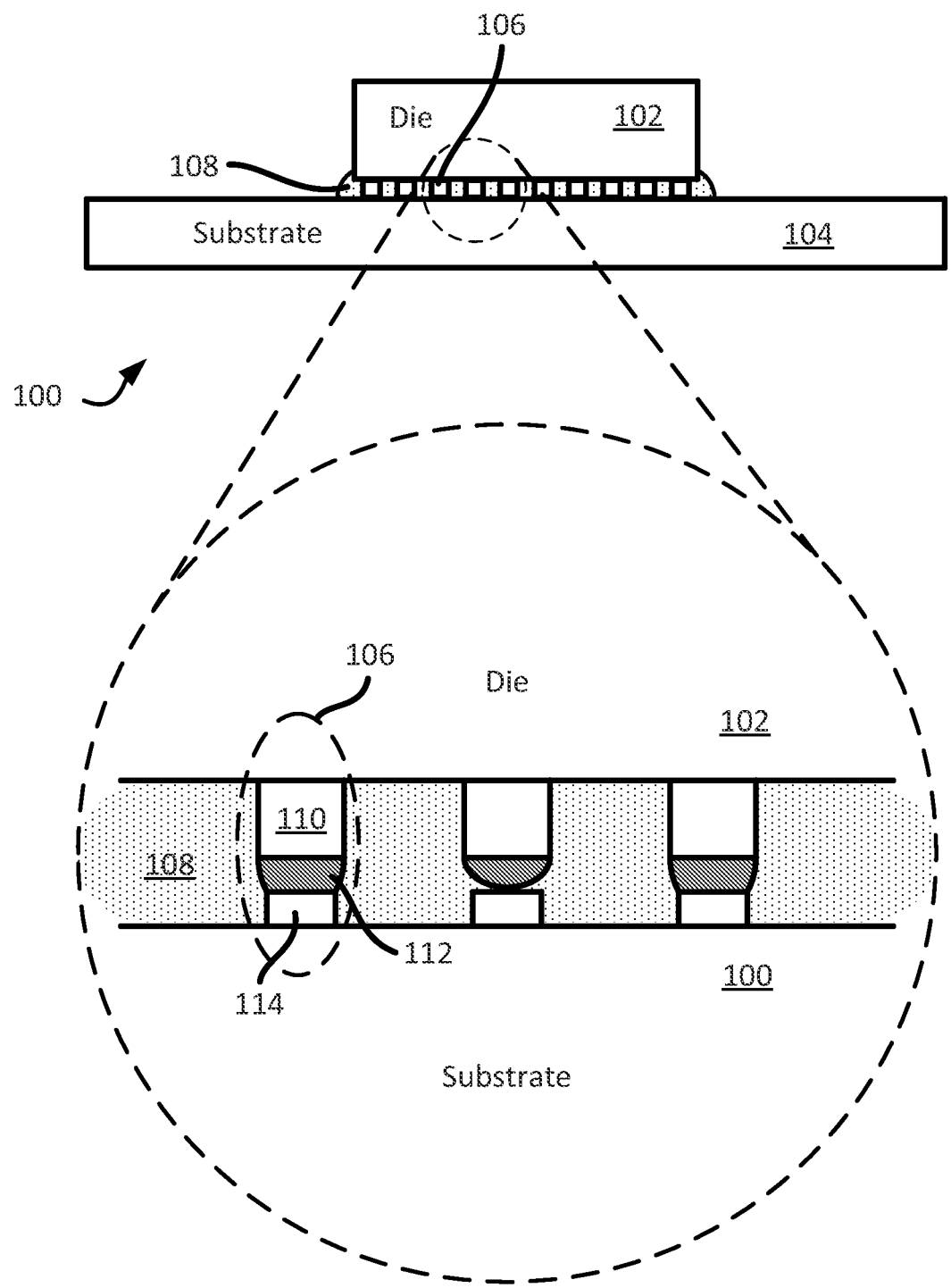
FIG. 1 illustrates a thermal compression flip chip coupled to a packaging substrate.
Figure 2:
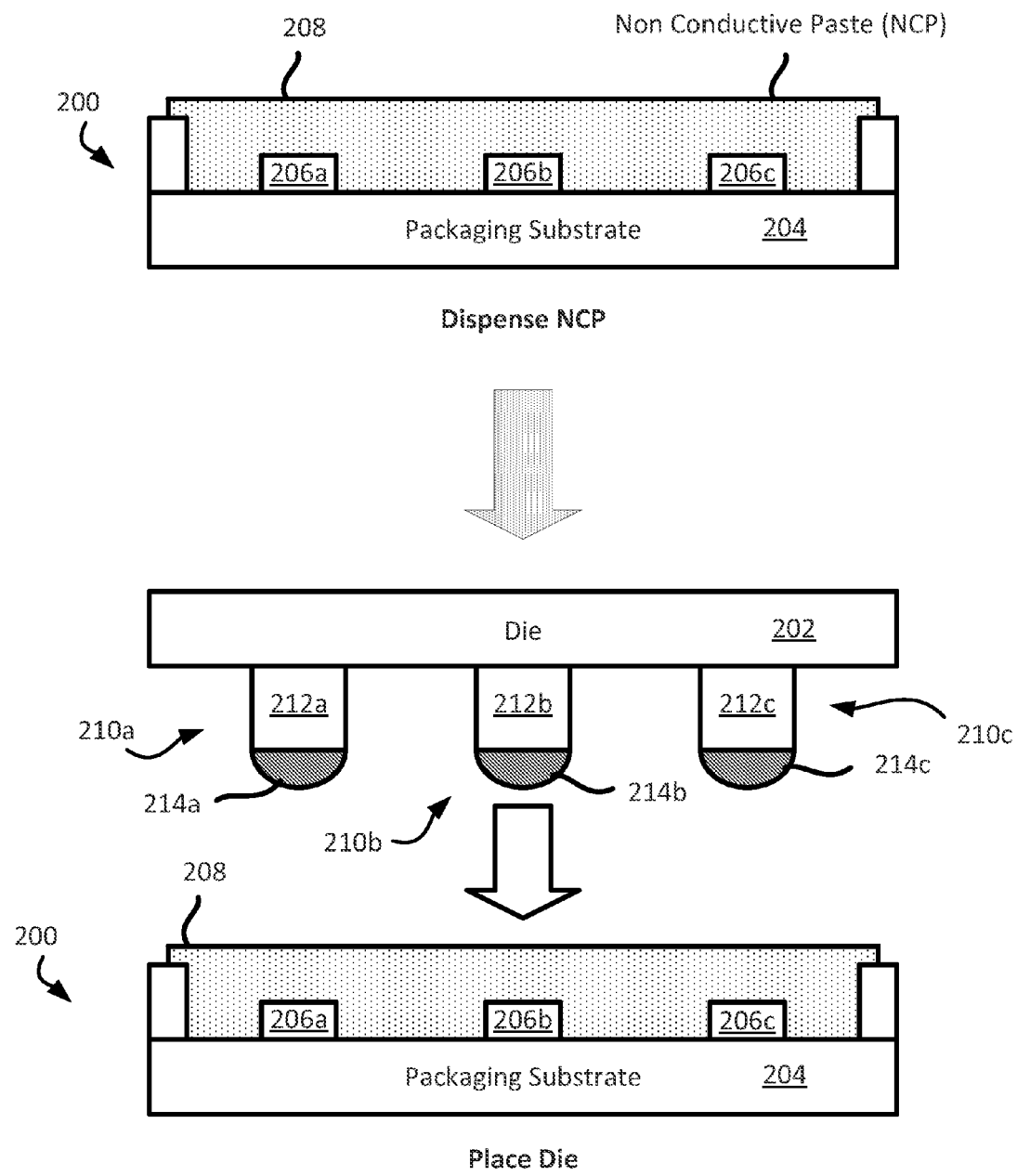
FIG. 2 illustrates a thermal compression flip chip being attached to a packaging substrate.
Figure 3:
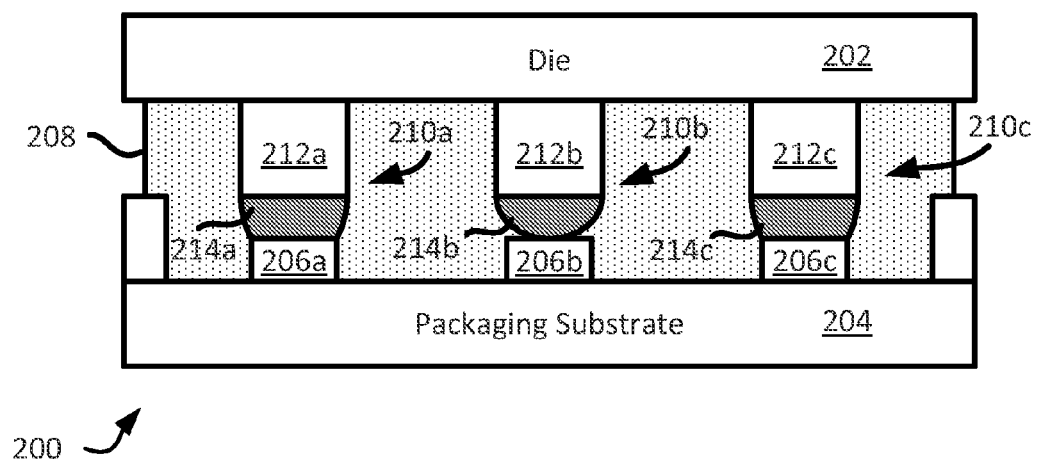
FIG. 3 illustrates a thermal compression flip chip coupled to a packaging substrate, where at least one joint between the flip chip and the packaging substrate is a poor joint.
Figure 4:
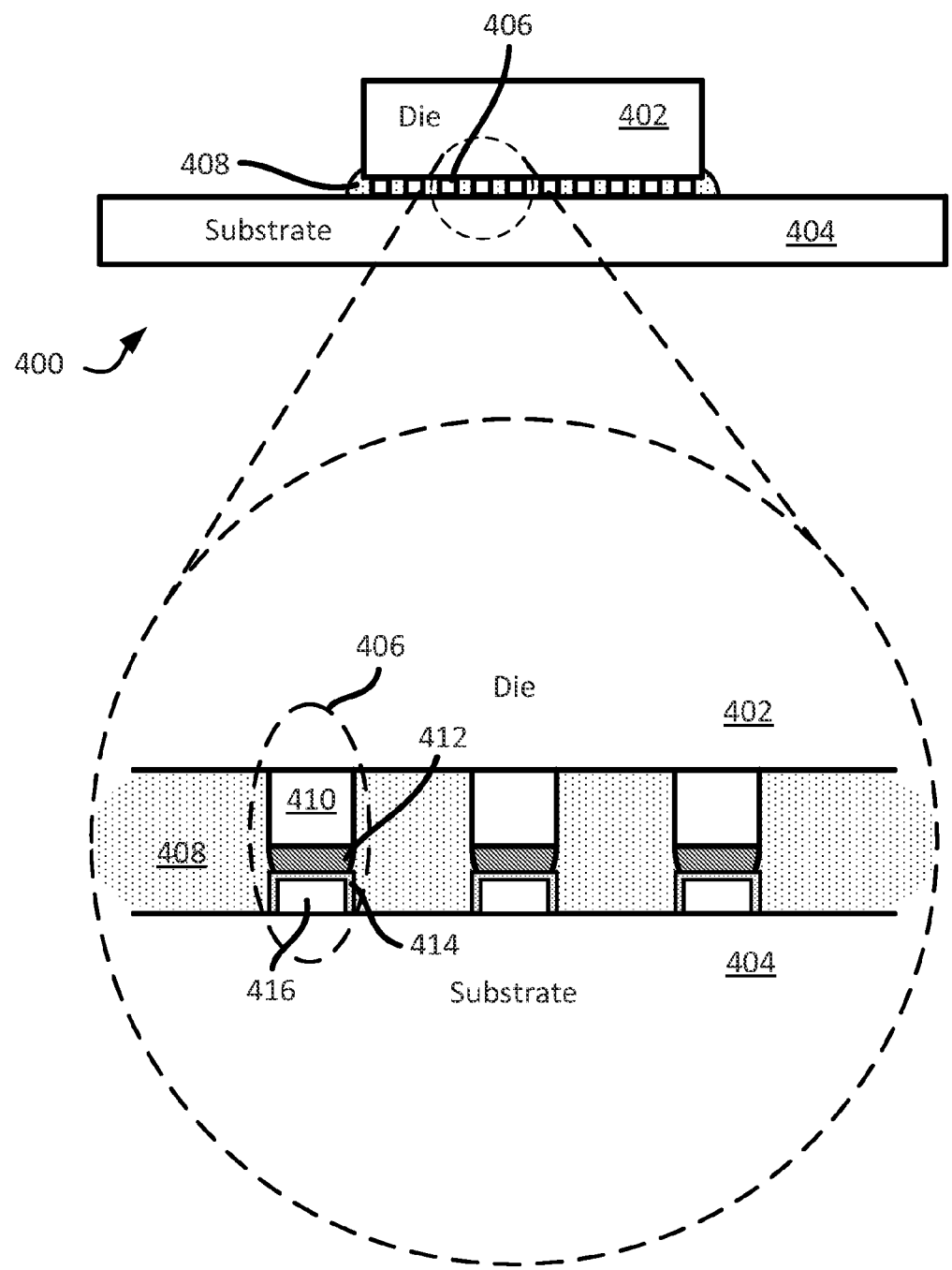
FIG. 4 illustrates a thermal compression flip chip coupled to traces having a conductive surface layers.

FIG. 4 illustrates an example of a package that includes a die coupled to a substrate, where the substrate includes a trace having a surface layer (e.g., conductive surface layer). As shown in FIG. 4, a package 400 includes a die 402 that is coupled to a substrate 404. There are several electrical connections (e.g., electrical connection 406) and a non-conducting paste (NCP) 408 between the die 402 and the substrate 404. The NCP 408 provides a protective layer that covers the electrical connections between the die 402 and the substrate 404. The NCP 108 may also provide fluxing capabilities in some implementations. The fluxing capability of a material may refer to a material's (e.g., NCP) ability to remove oxide from another material in some implementations. Different materials may have different ability to remove oxide. Some materials are more effective than others at removing oxide. In some implementations, using an NCP material with strong fluxing capability may create voiding between connections after the thermal compression process is completed and the NCP material is cured, which presents a reliability risk.

As shown in FIG. 4, the electrical connection 406 may be defined by a first component 410, a second component 412, a third component 414 and a fourth component 416. The first component 110 may be an under bump metallization (UBM) structure (e.g., pillar). The UBM structure may be a copper material. As such, the first component 410 may be a copper pillar. The second component 412 may be a solder that couples the first component 410 to the third component 414.

The third component 414 may be a surface layer (e.g., conductive surface layer) that provides a layer that has an oxidation property that is less susceptible to oxidation than the trace. In some implementations, the oxidation property of a material refers to how easily an oxide/oxide layer is formed when the material is exposed to air, water and/or other chemicals. In other words, an oxidation property of a material (e.g., surface layer) may refer to how susceptible the material is to oxidation (e.g., formation of an oxide/oxide layer on the material) due to air, water and/or other chemicals in some implementations. In some implementations, the use of such a surface layer (e.g., a surface layer having an oxidation property that is less susceptible to oxidation) may result in better, stronger joints between a die and a substrate. At a minimum, the surface layer increases the likelihood of good, better, stronger joints between a die and a substrate.

The third component 414 may be one surface layer or several surface layers. Different implementations may have different surface layers. Each surface layer may have different thicknesses. Examples of materials for surface layers include nickel, palladium, gold and/or combination thereof. In some implementations, these materials are chemically more noble (than copper for example), and as such, are less susceptible to oxidation. The different surface layers of some implementations will be further described below.

The fourth component 416 may be a trace of a packaging substrate in some implementations. The trace may be a copper material. The copper trace (e.g., fourth component 416) may have an oxidation property that is more susceptible to oxidation than the third component 414 (e.g., surface layer (s)) in some implementations.

Having described the various components of an electrical connection between a die and a substrate, an exemplary sequence for assembling a die to a substrate having traces that includes at least one surface layer will now be described.

Figure 5:
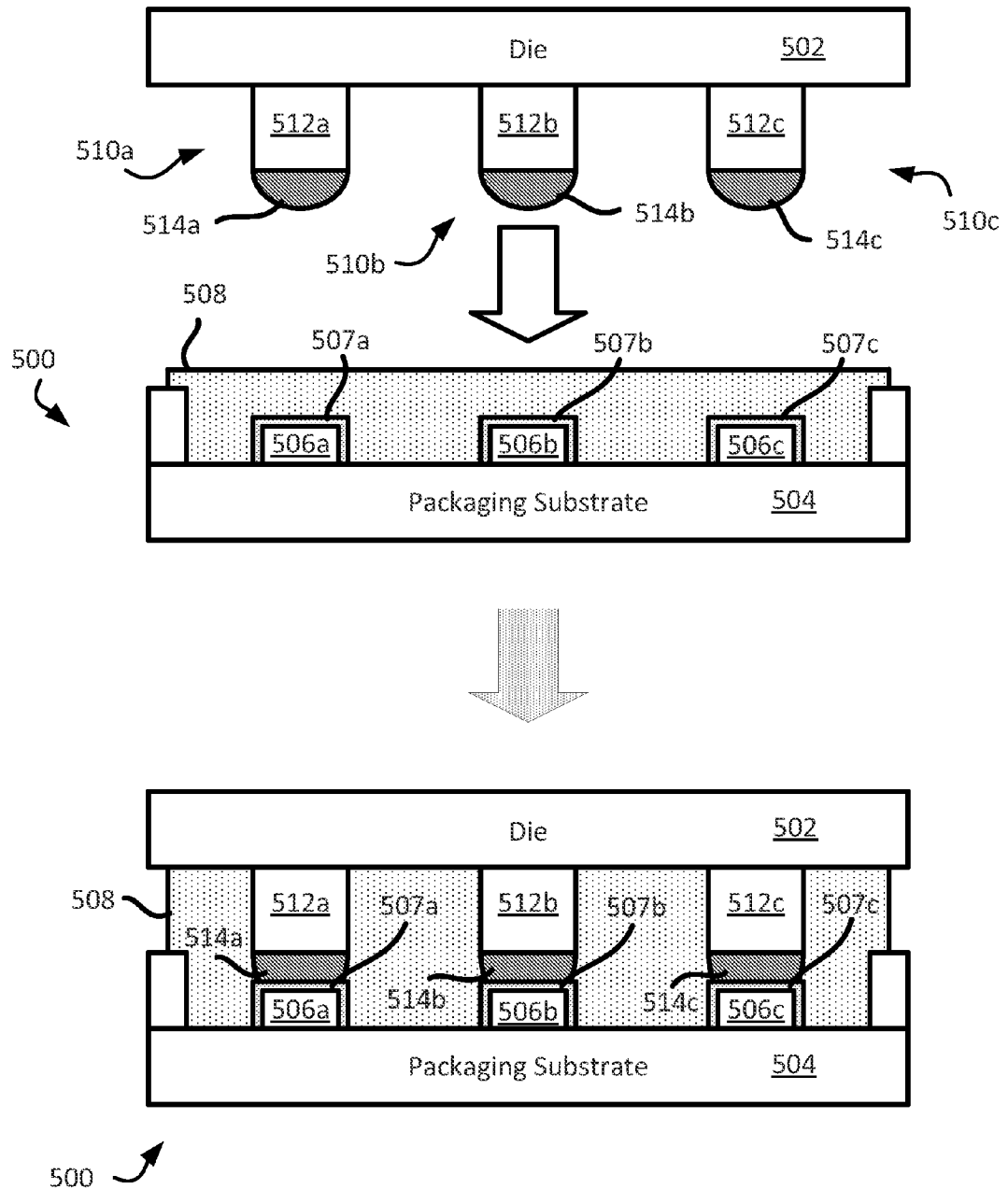
FIG. 5 illustrates a thermal compression flip chip being assembled to traces having a conductive surface layers.

FIG. 5 illustrates an example of how a die may be assembled to a package by using a thermal compression bonding process. Specifically, FIG. 5 illustrates a package 500 and a die 502. The package 502 includes a packaging substrate 504, several traces 506a-c, and several surface layers 507a-c. As shown in FIG. 5, each trace 506a-c includes a respective surface layer 507a-c. More specifically, each respective surface layer (e.g., conductive surface layer) is positioned on top portion and side portions of its respective trace. Each surface layer 507a-c may conceptually represent one surface layer or several surface layers. The surface layers 507a-c may be coupled to the respective traces 506a-c through one or more plating processes in some implementations FIG. 5 also illustrates a non conductive paste (NCP) 508, which is usually dispensed on top of the traces 506a-c before thermo-compression is done.

The die 500 includes several bumps 510a-c. Each of the bumps 504a-c respectively includes UBM structures (e.g., copper pillars) 512a-c, and may also include solders 514a-c. As further shown in FIG. 5, the bump 510a (which includes the UBM structure 512a and solder 514a) is coupled to the trace 506a, Similarly, the bump 510b (which includes the UBM structure 512b and solder 514b) is coupled to the trace 506b, and the bump 514c (which includes the UBM structure 512c and solder 514c) is coupled to the trace 506c.

As shown in 5, all the joints between the solder 514a-c and the surface layers 507a-c are good and/or strong, as illustrated by the fact that the solder 514a-c are in good contact with a substantial portion/part of the surface layers 507a-c. In some implementations, this is the result of using the surface layers 507a-c, which is made of one or more material that is less susceptible to oxidation (formation of an oxide/oxide layer) than the trace (e.g., copper trace). As discussed above, the oxide/oxide layer is what prevents the solder from properly wetting to traces 506a-c in some implementations. By using material that is less susceptible to oxidation (less likely to form oxide/oxide layer), it is more likely that the solder will properly wet to components of the substrate trace plated with surface layer), thereby it is more likely that a good joint will be produced during the assembly process.

FIGS. 4-5 illustrate surface layers that are coupled to top and side portions of traces. However, in some implementations, the surface layers may couple to different portions of traces or only some portions of the traces. Different implementations may have different surface layers. Each surface layer may have the same or different thicknesses. Examples of materials for surface layers include nickel, palladium, gold and/or combination thereof. The different surface layers of some implementations will now be further described below.

Exemplary Surface Layer Materials

Different implementations may use different material for different surface layers. In some implementations, one surface layer is coupled to a trace. In some implementations several layers may be coupled to a trace. Each layer may be made of different materials. Examples of materials for surface layers include nickel, palladium, gold and/or combination thereof.

In some implementations, the surface layers (e.g., conductive surface layer) may be coupled to the trace by using a plating process. The plating process may include dipping the trace in a bath solution that includes one or more materials. The trace may be dipped in the bath solution for a long enough period of time to produce a surface layer having a specified thickness. In some implementations, the plating process may include sequentially dipping the trace in series of bath solutions. Each bath solution may include a different material that is going to be coupled/plated to the trace. Examples of plating processes include electroplating, electroless plating, and immersion plating.

In some implementations, the materials that are used to couple/plate to the traces may be referred to as electroless nickel electroless palladium immersion gold (ENEPIG), electroless palladium immersion gold (EPIG), and electroless palladium (EP). These names may refer to the process of how these materials are coupled/plated onto the traces. In instances when thin nickel is used when nickel is less than or equal to 0.3 microns thin), the ENEPIG may be referred as thin nickel ENEPIG in some implementations. The sequence and/or order of the surface layers may be different for different implementations. That is, different implementations, may plate the trace with different materials in different order.

Some factors to consider when using surface layers on a trace is the pitch and/or spacing of traces. In some implementations, a pitch defines a center to center distance between two neighboring traces. In some implementations, a spacing defines the distance between edges of two neighboring traces (e.g., edges of outer surface layers of two neighboring traces). One advantage of using a thermal compression bonding process is that the pitch and/or spacing between traces on a substrate may be 100 microns (μm) or less. This allows for higher density connections on a die/substrate in some implementations. In contrast, in a reflow bonding process, the pitch or spacing between traces on a substrate is usually more than 120 microns (μm). Thus, when a substrate is intended to be coupled to a die by using a thermal compression bonding process, consideration must be given to the pitch or spacing of traces, including any surface layers that are added/coupled to the traces because the addition of the surface layers may result in the shorting of traces. Consequently, in some implementations, when adding/coupling surface layers to traces, it is important to use materials that are as thin as possible to avoid shorting of traces.

Different implementations may use different thicknesses for the surface layers. In some implementations, when nickel is used as the surface layer (e.g., surface layer 507b, surface layer 702b), the surface layer may have a thickness that is 0.3 microns (μm) or less. In some implementations, when a surface layer (e.g., surface layer 507c, surface layer 702c) is made of a combination of layers of nickel, palladium and gold, the combined thickness of the surface layer is 0.48 microns (μm) or less. In such instances, the nickel surface layer may have a thickness between 0.1-0.3 microns (μm), the palladium surface layer may have a thickness between 0.02-0.08 microns (μm), and the gold surface layer may have a thickness between 0.03-0.1 microns (μm) in some implementations.

In some implementations, the surface layer (e.g., surface layer 414, surface layer 416) is a combination of palladium and gold. More specifically, the surface layer may be a combination of electroless palladium and immersion gold. In other words, the surface layer may be a first electroless palladium surface layer and a second immersion gold surface layer. In some implementations, the palladium surface layer (e.g., electroless palladium) may have a thickness between 0.04-0.1 microns (μm) and the gold surface layer (e.g., immersion gold) may have a thickness between 0.03-0.1 microns (μm).

In some implementations, the surface layer may be a palladium layer electroless palladium). In such instance, the palladium surface layer may have a thickness between 0.04-0.2 microns (μm).

Having described the various materials used for one or more surface layers, a method for manufacturing a substrate that includes a trace coupled to one or more surface layers will now be described.

Figure 6:
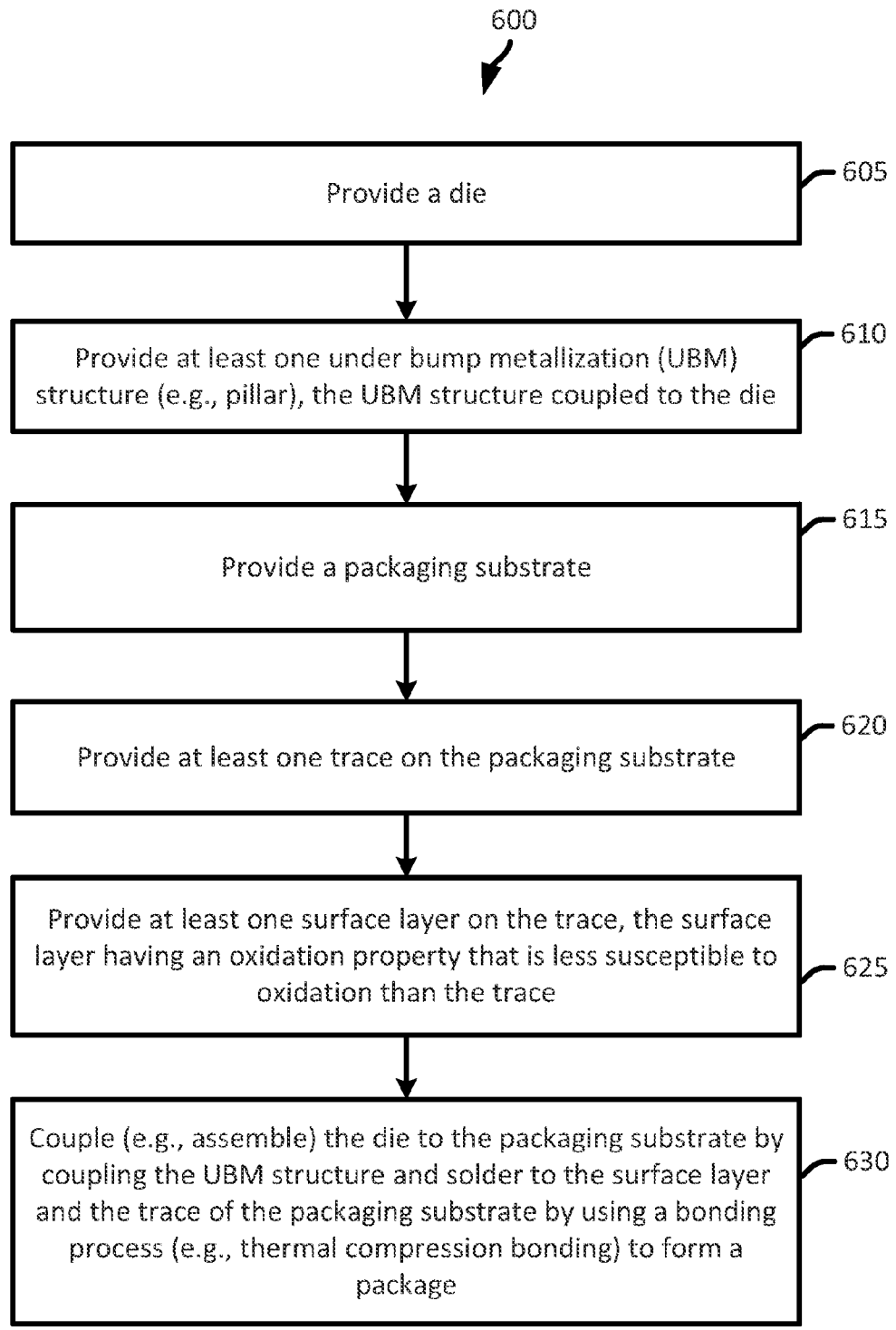
FIG. 6 illustrates a flow diagram for a method of manufacturing a die coupled to a substrate that includes a trace having a conductive surface layer.

Exemplary Method for Manufacturing Die Coupled to a Substrate that Includes a Trace Having a Conductive Surface Layer FIG. 6 illustrates a flow diagram for a method of manufacturing a die coupling the die to a substrate that includes a trace having a conductive surface layer. The method provides (at 605) a die. In some implementations, providing a die include manufacturing a die. Providing a die may include providing, defining, manufacturing active and passive components of a die, including defining and manufacturing metal and dielectric layers of a die. Next, the method provides (at 610) at least one under bump metallization (UBM) structure. The UBM structure may be for example, the UBM structure 410 shown in FIG. 4. The UBM structure may be a copper pillar in some implementations. After providing (at 610) the UBM structure, the method provides (at 615) a packaging substrate that includes at least one trace. Providing a packaging substrate may include manufacturing a packaging substrate. The packaging substrate may be for example, the substrate 404 of FIG. 4. After providing (at 615) the packaging substrate, the method provides (at 620) at least one trace on the packaging substrate. The traces may be made of a copper material. The trace may be for example, the trace 416 of FIG. 4.

After providing (at 620) at least one trace, the method provides (at 625) at least one surface layer on the trace, where the surface layer has an oxidation property that is less susceptible to oxidation than the trace (e.g., copper trace). The surface layer may be a conductive surface layer. In some implementations, providing the surface layer may include coupling the surface layer to a portion of the trace (e.g., top and/or side portions of the trace). Different implementations may provide different surface layers. In some implementations, providing the at least one surface layer includes providing several surface layers, where each surface layer may be a different material. Examples of materials used for the surface layers include nickel, palladium, gold and/or combination thereof. Moreover, providing the at least one surface layer may include performing one or more plating processes. Examples of plating processes include electroless plating and immersion plating. In some implementations, each respective surface layer is coupled to the trace during a respective plating process. In some implementations, a combination of different plating processes may be used.

Next, the method couples (at 630) the die to the packaging substrate by coupling the UBM structure and a solder to the surface layer and the trace of the packaging substrate and ends. The die may be coupled (e.g., assembled) to the packaging substrate by using a thermal compression bonding process in some implementations. Although some implementations may use a reflow bonding process to couple the die to a substrate. In some implementations, coupling (e.g., assembling) the die to the packaging substrate includes coupling several UBM structures and solders to several surface layers and traces.

As described above, in some implementations, one or more surface layers may be coupled to a trace. A method for providing traces with at least one surface layer will be further described below.

Exemplary Method for Providing Traces with at Least One Surface Layer

Figure 7:
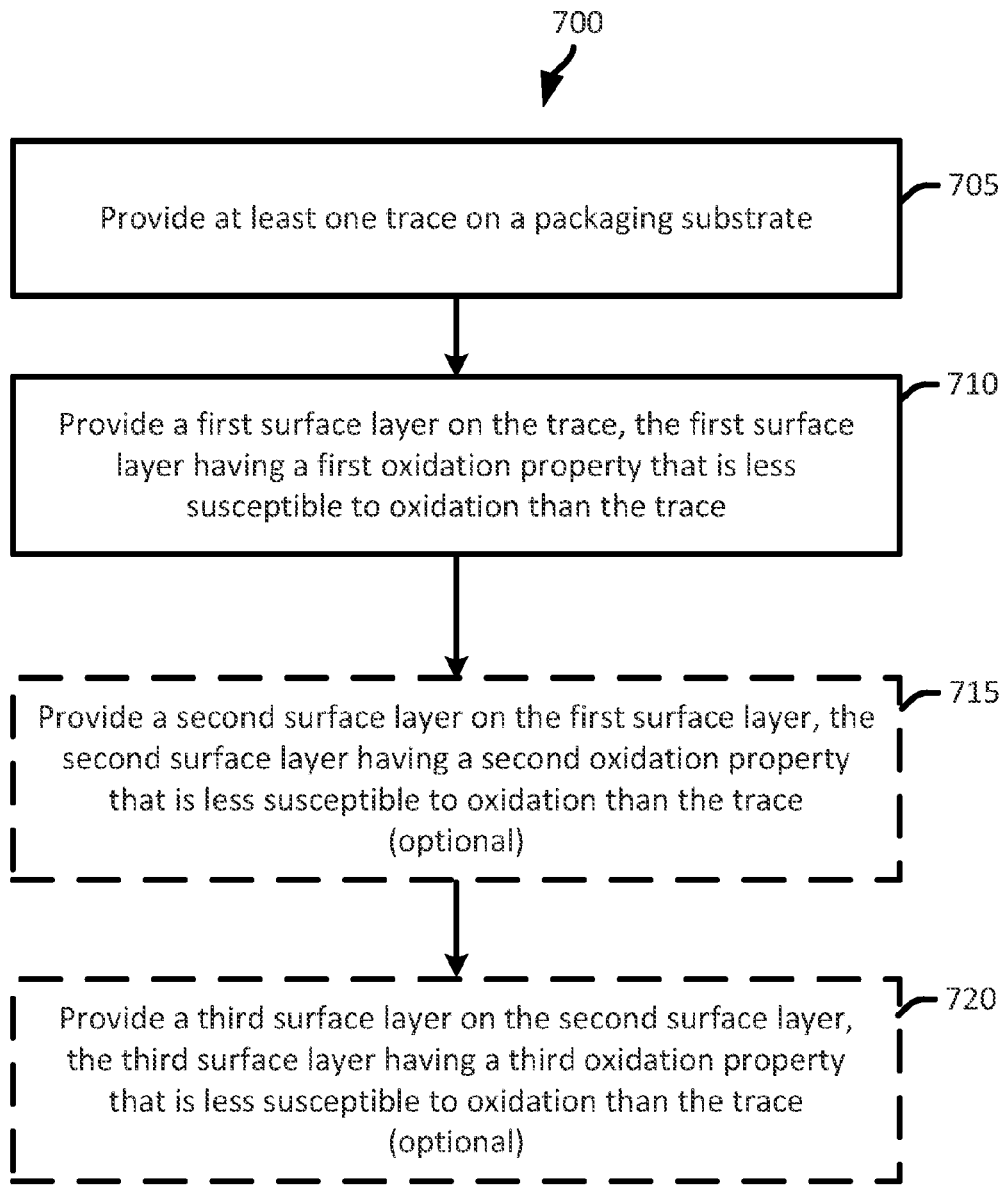
FIG. 7 illustrates a flow diagram for a method for providing one or more surface layers on a trace.

FIG. 7 illustrates a flow diagram of a method for providing traces with at least one surface layer. As shown in FIG. 7, the method provides (at 705) at least one trace on a packaging substrate. In some implementations, providing a trace includes manufacturing at least one trace on a substrate. The traces may be made of a copper material. The trace may be for example, the trace 416 of FIG. 4. In some implementations, the pitch between the neighboring traces on the substrate is 100 microns (μm) or less. In some implementations, the spacing between neighboring traces on the substrate is between 10-20 microns (μm) or less.

Next, the method provides (at 710) a first surface layer on the trace. The first surface layer has a first oxidation property that is less susceptible to oxidation than the oxidation property of the trace. The first surface layer may be a conductive layer. In some implementations, providing the first surface layer includes performing a plating process on the trace to plate the first surface layer on the trace. This may include performing an electroless plating process. In some implementations, the first surface layer is nickel, palladium or gold. In some implementations, when gold is the surface layer, an immersion plating process may be used. Different implementations may provide different thicknesses for the first surface layer.

In some implementations, depending on the material that is used as the first surface layer, the method may skip providing (e.g., adding) additional surface layers. For example, in some implementations, palladium may be the only surface layer that is provided on the trace. In other implementations, other surface layers may be provided as well.

After providing (at 710) the first surface layer on the trace, the method may optionally provide (at 715) a second surface layer on the trace. The second surface layer may be a conductive layer. In some implementations, providing the second surface layer includes coupling the second surface layer to the first surface layer. The second surface layer has a second oxidation property that is less susceptible to oxidation than the oxidation property of the trace. In some implementations, providing the second surface layer includes performing a plating process on the trace that includes the first surface layer. Examples of plating processes include electroless plating and immersion plating. The second surface layer may be palladium or gold in some implementations.

After optionally providing (at 715) the second surface layer on the trace that includes the first surface layer, the method may optionally provide (at 720) a third surface layer on the trace and ends. The third surface layer may be a conductive layer. In some implementations, providing the third surface layer includes coupling the third surface layer to the second surface layer. The third surface layer has a third oxidation property that is less susceptible to oxidation than the oxidation property of the trace. In some implementations, providing the third surface layer includes performing a plating process on the trace that includes the first and second surface layers. Examples of plating processes include electroless plating and immersion plating. The third surface layer may be gold (e.g., immersion gold) in some implementations.

Having described a method for providing at least one trace with at least one surface layer, a sequence for providing a trace with at least one surface layer and coupling the trace having at least one surface layer to an under bump metallization (UBM) structure and solder will now be described below.

Figure 8A:
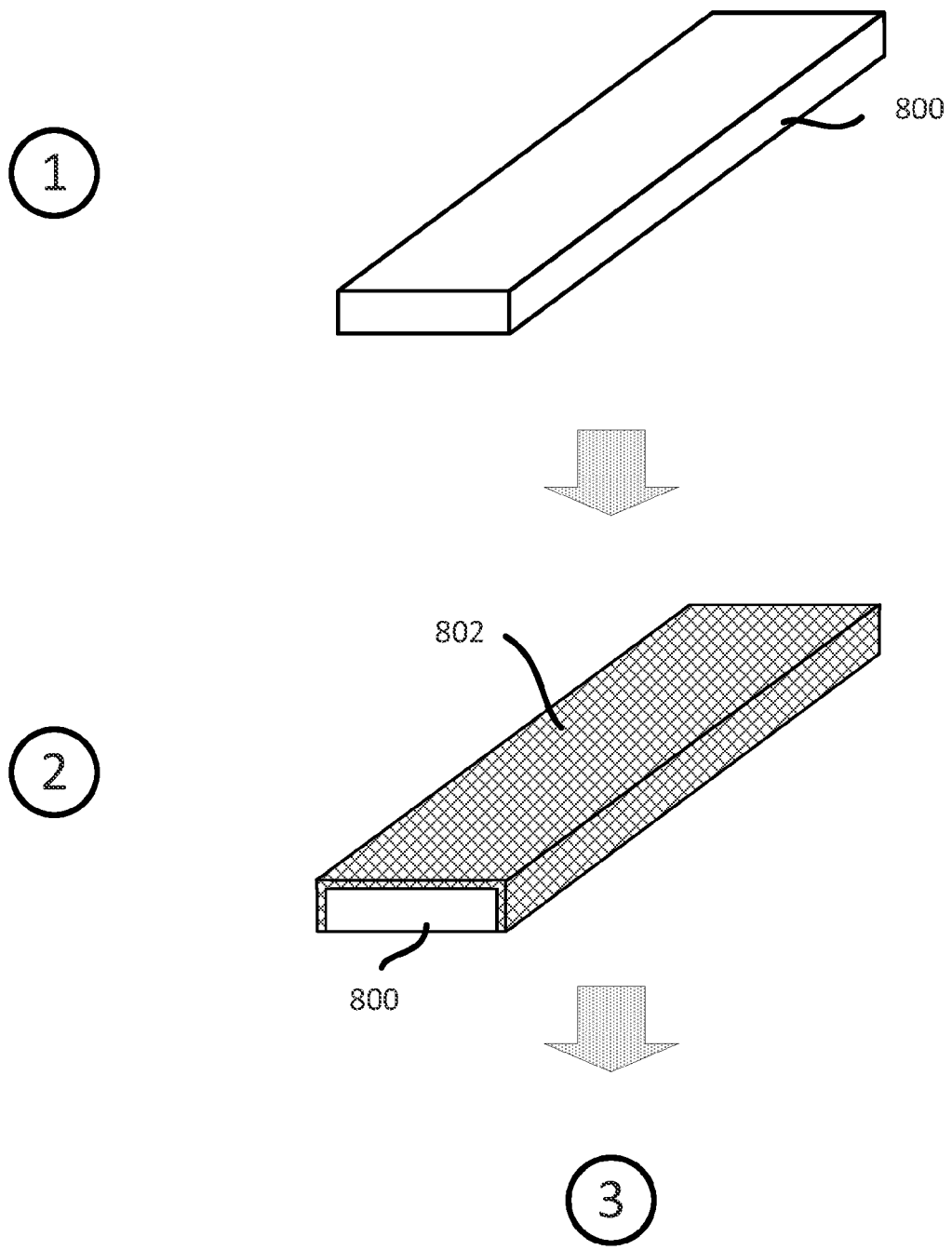
FIGS. 8A-8C illustrate a sequence for manufacturing a substrate that includes a trace having a conductive surface layer and coupling the trace to a bump of a thermal compression flip chip.
Figure 8B:
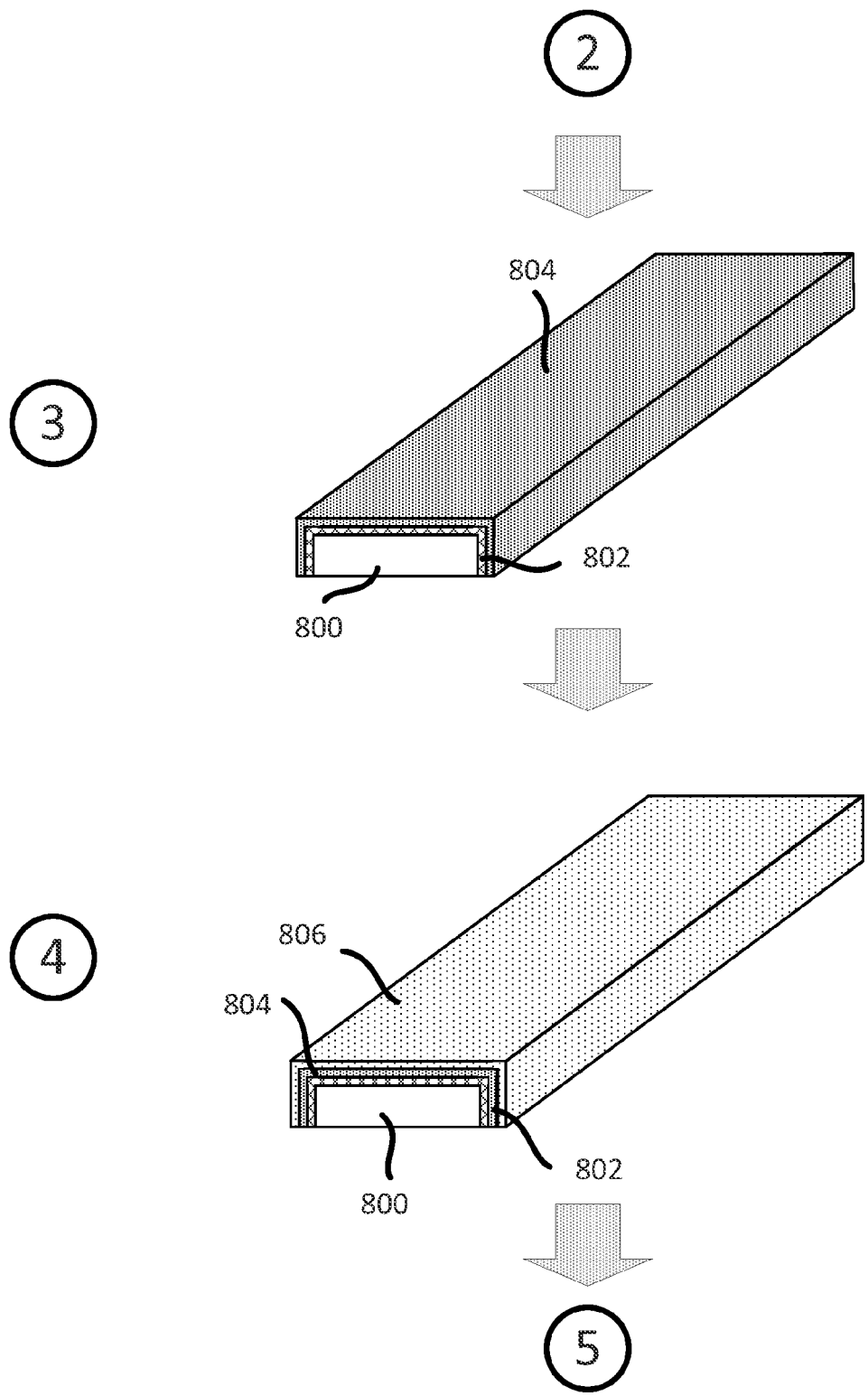
Figure 8C:
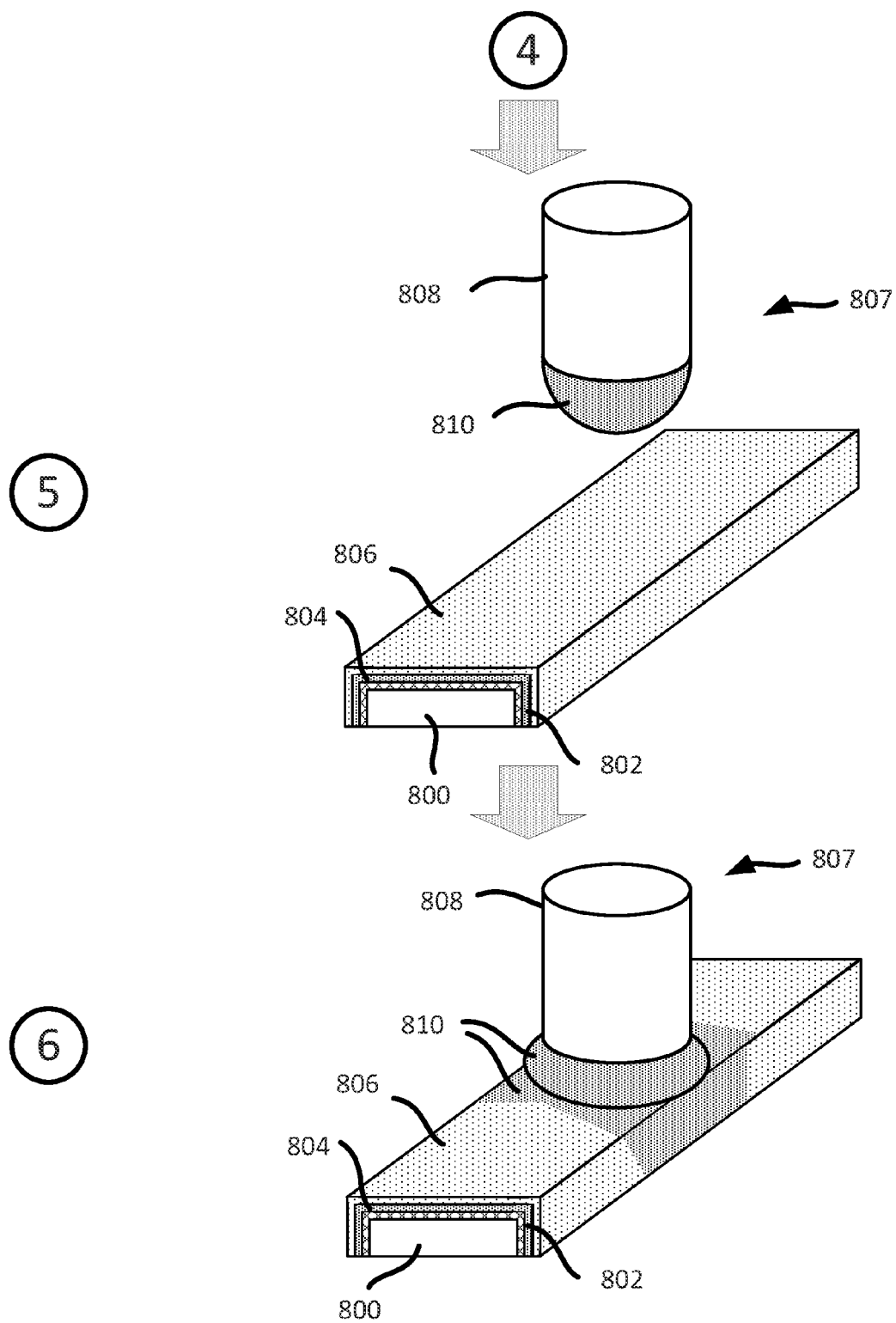

Exemplary Sequence for Coupling a UBM Structure and Solder to a Trace Having at Least One Surface Layer FIGS. 8A-8C illustrates a sequence for coupling a UBM structure and solder to a trace having at least one surface layer. It should be noted that for the purpose of clarity and simplification, the processes of FIGS. 8A-8C do not necessarily include all the steps and/or stages of manufacturing/coupling a die to a packaging substrate. Moreover, in some instances, several steps and/or stages may have been combined into a single step and/or stage in order to simplify the description of the processes. In addition, the components illustrated in the FIGS. 8A-8C are merely conceptual illustrations and unless otherwise explicitly stated, do not necessarily represent the actual and/or relative dimensions of these components. In some instances, some of the dimensions may have been exaggerated to clearly illustrate/distinguish features of some of the components.

Stage 1 of FIG. 8A illustrates a trace 800. The trace 800 may be a trace on a packaging substrate. The trace 800 may be a copper trace. For purpose of clarity and simplicity, only one trace is shown. Stage 2 illustrates a first conductive surface layer 802 that has been applied, to a portion (e.g., top and side portions) of the trace 800. The first conductive surface layer 802 may be made of a material that is less susceptible to oxidation than the trace 800. In some implementations, the first conductive surface layer 802 may be plated to the trace 800. Examples of plating processes include electroplating, electroless plating, and, immersion plating. In some implementations, the first conductive surface layer 802 may be nickel, palladium, or gold. The first conductive surface layer 802 may have different thicknesses. For example, the first conductive surface layer 802 may have a thickness of 0.3 microns (μm) or less.

Stage 3 of FIG. 8B illustrates a second conductive surface layer 804 that has been applied to a portion of the trace 800. More specifically, the second conductive surface layer 804 has been applied on top (e.g., top and side portions) of the first conductive surface layer 802. The second conductive surface layer 804 may be made of a material that is less susceptible to oxidation than the trace 800. In some implementations, the second conductive surface layer 804 may be plated to the trace 800 (and/or the first conductive surface layer 802). Examples of plating processes include electroplating, electroless plating, and immersion plating. In some implementations, the second conductive surface layer 804 may be palladium or gold. The second conductive surface layer 804 may have different thicknesses. In some implementations, the second conductive surface layer 804 may have a thickness of 0.1 microns (μm) or less.

Stage 4 of FIG. 8B illustrates a third conductive surface layer 806 that has been applied to a portion of the trace 800. More specifically, the third conductive surface layer 806 has been applied on top (e.g., top and side portions) of the second conductive surface layer 804. The third conductive surface layer 806 may be made of a material that is less susceptible to oxidation than the trace 800. In some implementations, the third conductive surface layer 806 may be plated to the trace 800 (and/or the second conductive surface layer 804). Examples of plating processes include electroless plating, and immersion plating. In some implementations, the third conductive surface layer 806 may be gold. The third conductive surface layer 806 may have different thicknesses. In some implementations, the third conductive surface layer 806 may have a thickness of 0.1 microns (μm) or less.

Stage 5 of FIG. 8C illustrates a bump 807 that includes an under bump metallization (UBM) structure 808 and a solder 810, being coupled to the trace 800 that includes the first conductive surface layer 802, the second conductive surface layer 804, and the third conductive surface layer 806. Stage 6 illustrates the bump 807 coupled to the trace 800 that includes the first conductive surface layer 802, the second conductive surface layer 804, and the third conductive surface layer 806. More specifically, stage 6 illustrates the solder 810 coupled to third conductive surface layer 806 of the trace 800. As shown in stage 6 of FIG. 8C, because the third conductive surface layer 806 is less susceptible to oxidation, the joint between the die and package is more likely to be good and strong.

FIGS. 8A-8C illustrate three surface layers being coupled (e.g., added) to the trace. However, in some implementations, a different number of surface layers may be coupled to the trace. (e.g., only one surface layer, two surface layers, or more than 3 surface layers).

Exemplary Electronic Devices

Figure 9:
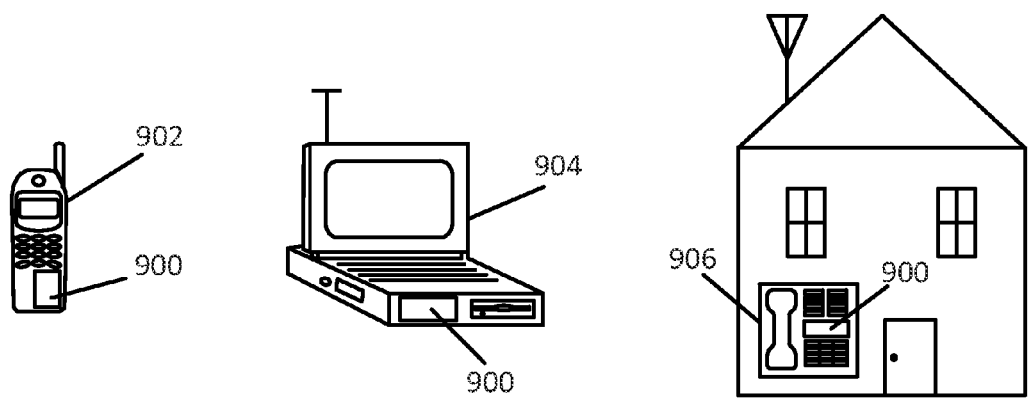
FIG. 9 illustrates various electronic devices that may integrate the IC described herein.

FIG. 9 illustrates various electronic devices that may be integrated with any of the aforementioned integrated circuit, die or package. For example, a mobile telephone 902, a laptop computer 904, and a fixed location terminal 906 may include an integrated circuit (IC) 900 as described herein. The IC 900 may be, for example, any of the integrated circuits, dice or packages described herein. The devices 902, 904, 906 illustrated in FIG. 9 are merely exemplary. Other electronic devices may also feature the IC 900 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another— even if they do not directly physically touch each other. For instance, the substrate of the die may be coupled to the packaging substrate even though the substrate of the die is never directly physically in contact with the packaging substrate.

The terms wafer and substrate may be used herein to include any structure having an exposed surface with which to form an integrated circuit (IC) according to aspects of the present disclosure. The term die may be used herein to include an IC. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art. The term "horizontal" is defined as a plane substantially parallel to the conventional plane or surface of a wafer or substrate, regardless of the orientation of the wafer or substrate. The term "vertical" refers to a direction substantially perpendicular to the horizontal as defined above. Prepositions, such as "on," "upper," "side," "higher," "lower," "over," and "under" when used with respect to the integrated circuits described herein are defined with respect to the conventional plane or surface being on the top surface of the wafer or substrate, regardless of the orientation of the wafer or substrate. The prepositions "on," "upper," "side," "higher," "lower," "over," and "under" are thereby defined with respect to "horizontal" and "vertical."

One or more of the components, steps, features, and/or functions illustrated in FIGS. 4, 5, 6, 7, 8A-8C and/or 9 may be rearranged and/or combined into a single component, step, feature or function or embodied in several components, steps, or functions. Additional elements, components, steps, and/or functions may also be added without departing from the invention.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor device comprising:
   a substrate coupled to a die; and
   a plurality of traces coupled to the substrate, each respective trace comprising a first conductive material having a first oxidation property and having a top surface and side surfaces along the trace and a first surface layer on the top surface and side surfaces of the trace, the first surface layer comprising a nickel having a second oxidation property, the second oxidation property being less susceptible to oxidation than the first oxidation property, the first and second conductive materials configured to provide an electrical path between the die and the substrate, the first nickel surface layer having a thickness that is 0.3 microns (μm) or less.

2. The semiconductor device of claim 1, wherein the trace further includes a second surface layer made of palladium, the palladium second surface layer having a thickness between 0.02-0.08 μm.

3. The semiconductor device of claim 1, wherein the first surface layer is plated to the top surface and side surfaces of the trace using an electroless plating process.

4. The semiconductor device of claim 2, wherein the trace further includes a third surface layer made of gold, the gold third surface layer having a thickness between 0.03-0.1 μm.

5. The semiconductor device of claim 4, wherein the gold third surface layer is plated to the top surface and side surfaces of the trace using an immersion plating process.

6. The semiconductor device of claim 1, wherein the thickness of the nickel first surface layer is between 0.1-0.3 μm.

7. The semiconductor device of claim 6, wherein the nickel first surface layer is plated to the top surface and side surfaces of the trace using an electroless plating process.

\* \* \* \* \*